(12) United States Patent
Tsai

(10) Patent No.: US 6,465,367 B1
(45) Date of Patent: Oct. 15, 2002

(54) LOSSLESS CO-PLANAR WAVE GUIDE IN CMOS PROCESS

(75) Inventor: Chaochieh Tsai, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/771,188

(22) Filed: Jan. 29, 2001

(51) Int. Cl.[7] .............................................. H01L 21/469
(52) U.S. Cl. ....................... 438/778; 438/783; 438/787; 438/791
(58) Field of Search ................................. 438/778, 783, 438/786, 787, 791

(56) References Cited

U.S. PATENT DOCUMENTS

| | | | |
|---|---|---|---|
| 4,587,541 A | 5/1986 | Dalman et al. ................. 357/22 |
| 5,256,996 A | 10/1993 | Marsland ey al. ............. 333/20 |
| 5,519,342 A * | 5/1996 | McEwan ..................... 327/94 |
| 5,571,740 A | 11/1996 | Peterson ...................... 437/51 |
| 5,986,517 A * | 11/1999 | Kobayashi et al. ......... 333/104 |

* cited by examiner

*Primary Examiner*—David Nelms
*Assistant Examiner*—Renee' R. Berry
(74) *Attorney, Agent, or Firm*—George O. Saile; Stephen B. Ackerman; William J. Stoffel

(57) ABSTRACT

A structure and method of manufacturing a CMOS device where the Coplanar wave guide (CPW) lines are formed above the top metal lines. Also other insulating layers are provided that reduce the e-field from the signal line to the substrate. There are four embodiments. In the first embodiment, the following layers are formed over the semiconductor structure: the passivation layer, a shielding layer, a first insulator layer, a high K dielectric layer, a CPW and a second insulator layer. In the second embodiment, no shielding layer is used and the high k dielectric layer is thicker than in the first embodiment. In the third embodiment, a thick shielding layer is used and no high k dielectric layer. In the fourth embodiment, the top metal layer is used as a shielding layer and no high k dielectric layer is used.

28 Claims, 5 Drawing Sheets

US 6,465,367 B1

LOSSLESS CO-PLANAR WAVE GUIDE IN CMOS PROCESS

BACKGROUND OF THE INVENTION

1.) Field of the Invention

This invention relates generally to fabrication of semiconductor devices and more particularly to the fabrication of a Co-Planar Wave guide (wiring metal) in a conventional CMOS process and more particularly to Lossless Co-Planar Wave guide (CPW) in CMOS Process.

2.) Description of the Prior Art

Conventional devices have the signal lines (e.g., microwave microstrip lines) near the silicon substrate. The signal lines generate e-fields near the substrate that are a problem. Due to the Si-substrate's characteristic (loosy) to dissipate energy (from the e-fields), it is difficult to fabricate a microwave microstrip line (or signal line) in the conventional CMOS process.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,571,740 (Peterson) shows a capped microwave circuit with a standard ground plane layer.

U.S. Pat. No. 5,256,996 (Marshand et al.) shows a coplanar strip process.

U.S. Pat. No. 4,587,541 (Dalman et al.) teaches a method for a coplanar wave guide.

SUMMARY OF THE INVENTION

It is an object of the present invention to provide a method for fabricating a Coplanar wave guide (CPW) (e.g., signal line) above the top metal layer and passivation layer.

It is an object of the present invention to provide a method for fabricating a signal line in a conventional CMOS process.

To accomplish the above objectives, the present invention provides a method of manufacturing a CMOS device where the CPW lines are formed above the top metal line and where other insulating layer are provide that reduce the e-field from the signal line to the substrate. There are four embodiments as follows.

In the first embodiment, the following layers are formed over the semiconductor structure, the passivation layer, a shielding layer (e.g., Au), a first insulator layer, a high K dielectric layer, a CPW and a second insulator layer.

In the second embodiment, no shielding layer is used and the high k dielectric layer is thicker than in the first embodiment.

In the third embodiment, a thick shielding layer is used and no high k dielectric layer.

In the fourth embodiment, the top metal layer is used as a shielding layer and no high k dielectric layer is used.

The present invention achieves these benefits in the context of known process technology. However, a further understanding of the nature and advantages of the present invention may be realized by reference to the latter portions of the specification and attached drawings.

BRIEF DESCRIPTION OF THE EMBODIMENT

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A. Problem Invention Solves

Figure 5:
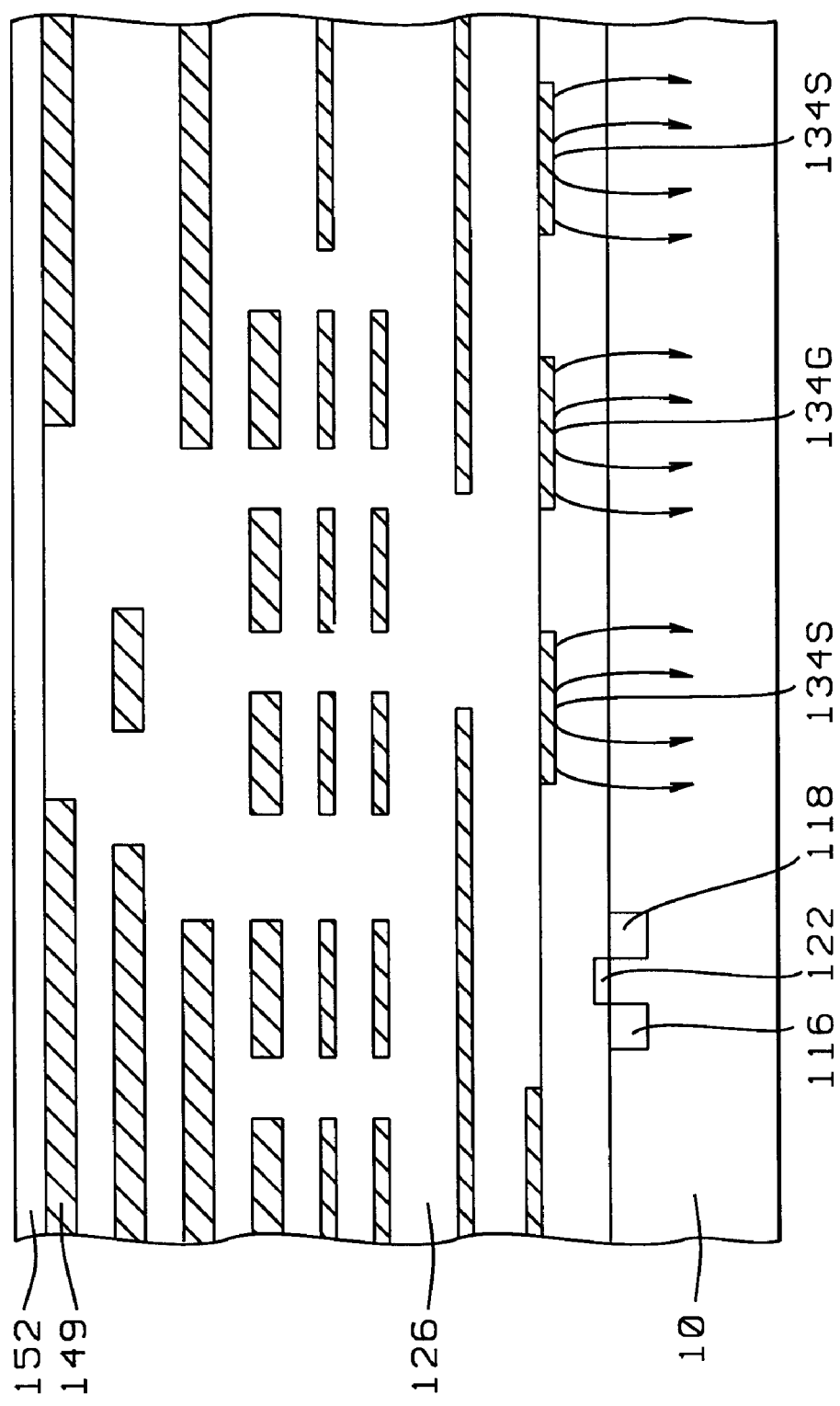
FIG. 5 shows a cross sectional view of a device having the signal line 34S 34G as any conductive line over the substrate except for the top metal line according to the prior art.

Referring now to the drawings and more particularly to FIG. 5, there is shown a structure known to the inventors over which the present invention is an improvement. It is to be understood in this regard that no portion of FIG. 5 is admitted to be prior art as the present invention. Rather, this highly simplified diagram is an effort to provide an improved understanding of the problems that are overcome by the invention.

FIG. 5 shows a Si substrate 10 with devices 116 118 122 on the substrate and metal lines 134S 134G as the signal lines and insulating layers 126 (inter metal dielectric, (IMD)). Passivation layer 152 is formed over the top metal layer. The signal lines 134S 134G generate e-fields (Shown as curved arrows) near the (silicon) substrate 10 that are a problem. FIG. 5 shows a cross sectional view of a device having the signal line 134S 134G as any conductive line (e.g., M1, M2, M3) over the substrate but not the top metal line 149 according to a process known to the inventors. The first level conductive line 134S 134G (e.g., M1) is used as a signal line. FIG. 5 shows the electric field generated by the signal lines. In processes known to the inventor, the signal lines are formed in any conductive line over the substrate except for the top metal line. The backside of the substrate is polished back so that the Silicon substrate is only about 250 Åthick. Next, ground plane 146 is formed on the backside of the substrate 10. Due to the loosy Si-substrate, it is difficult to fabricate a microwave microstrip line (signal line) in the conventional CMOS process.

II. Overview of the Four Embodiments

To accomplish the above objectives, the present invention provides a method of manufacturing a CMOS device where the co-planar wave guide (CWG) line is formed above the top metal line and where other insulating layer are provide that reduce the e-field from the signal line to the substrate. There are four embodiments as follows.

In the first embodiment, the following layers are formed over the semiconductor structure, the passivation layer 52, a shielding layer (e.g., Au) 56, a first insulator layer 60, a high K dielectric layer 64, a CWG 68G 68S and a second insulator layer 76.

In the second embodiment, no shielding layer (e.g., 56) is used and the high k dielectric layer 164 is thicker than in the first embodiment (e.g., 64).

In the third embodiment, a thick shielding layer (256) is used and no high k dielectric layer (e.g., No layer 64).

In the fourth embodiment, the top metal layer 348 is used as a shielding layer and no high k dielectric layer (e.g., 56) is used.

III. First Embodiment—FIG. 1

Figure 1:
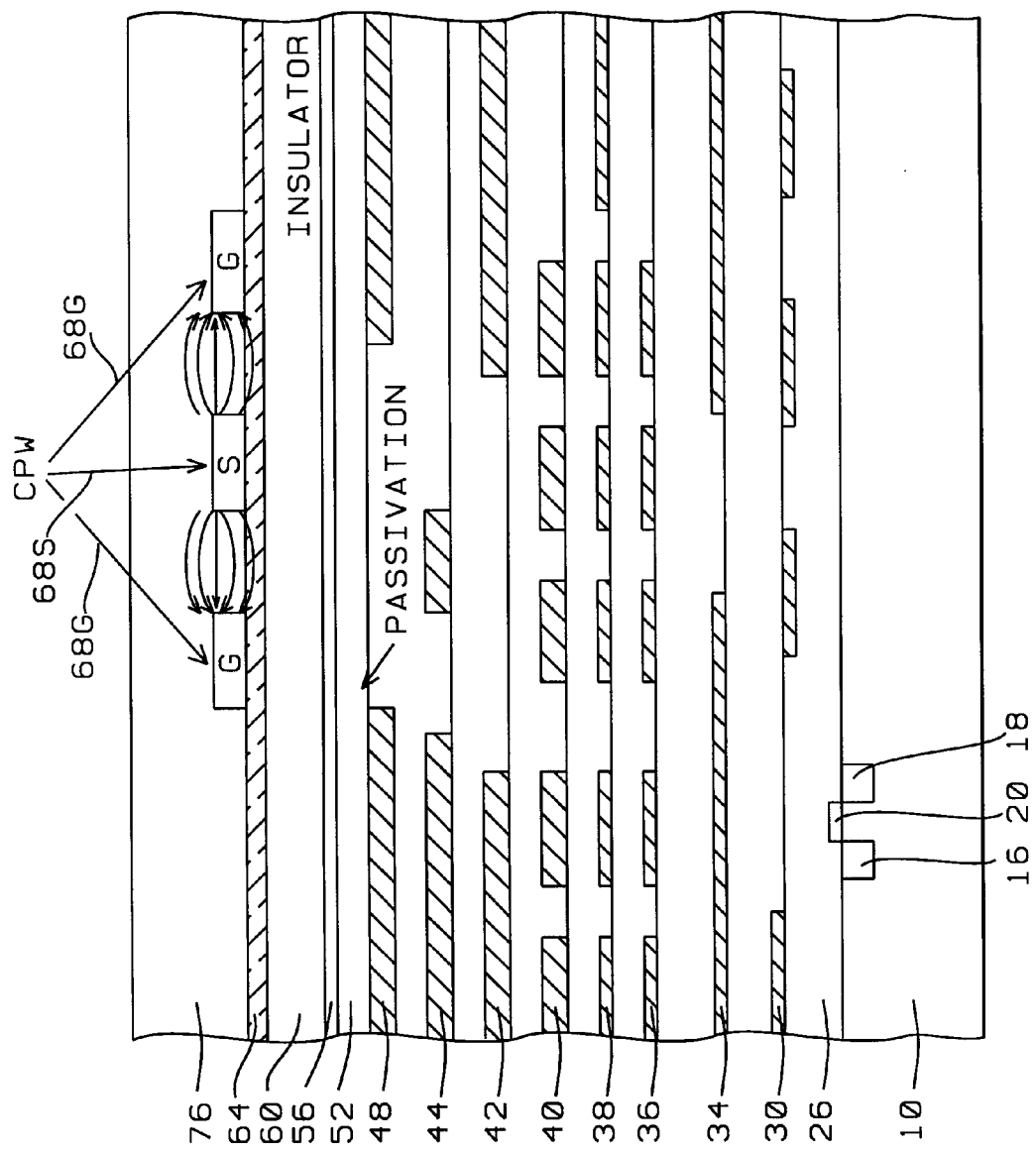
FIG. 1 is a cross sectional view of a device the ground plane as the top metal line and the signal line (microstrip) as a conductive line over the dielectric (e.g., polyimide) layer according to the first embodiment of the present invention.

As shown in FIG. 1 the structure of first embodiment of the invention is shown. The first embodiment has the following key features:

1) Au shielding plane 56
2) High K dielectric layer 64
3) Wiring metal or co-planar wave guide (CPW) formed over the high k dielectric layer 64.

The first embodiment has advantages of the high K layer 64 (e.g., $Ta_2O_5$) can stop the EM field (generated by the CPW 68S 68G) above the passivation layer. Also, it can save the Au layer thus reducing cost.

The method for forming the planar wave guide (CPW) (wiring layer, or signal line or transmission line) is described below.

The CPW line can be refer to as: 1) the wiring layer, 2) the signal line, 3) the transmission line 4) microstrip or 5) microwave microstrip.

As shown in FIG. 1, we provide a semiconductor structure 11 comprising a substrate 10 having devices 14 18 20 formed thereover and a plurality of insulating 26 (e.g., interlevel dielectric (ILD) or inter metal dielectric (IMD)) and conductive layers 30 34 36 38 40 42 44 (e.g., M1, M2, M3, etc.) thereover and a top metal layer 48. The top metal layer is formed under the passivation layer 52. The passivation layer has a different composition/function than the inter metal dielectric layers. The passivation layer protects the underlying layers from contaminates and moisture. The passivation layer is typically more durable than the inter metal dielectric layers. The plurality of insulating and conductive layers preferably has at least 5 insulating layer (e.g., ILD and IMD layers) and 5 conductive layers (e.g., poly1, M1, etc). The substrate is preferably silicon and preferably has a resistivity between 10 and 20 Ohm-cm.

Next, we form a passivation layer 52 over the top metal layer 48 and the semiconductor structure 11. The passivation layer 52 is preferably comprised of an oxide layer and a nitride layer. Preferably the nitride layer is on the oxide layer. The oxide layer preferably has a thickness of between about 5000 and 10,000 Å. The nitride layer preferably has a thickness between 1000 and 5000 Å.

Next, we form a ground plane (e.g., Au shielding plane) 56 over the passivation layer 52. The ground plane is important because it can prevent the electromagnetic field generated by the CPW 68G 68S from penetrating into the substrate.

The ground plane 56 is preferably comprised of Au or Cu and most preferably Au.

Next, we form a first insulator layer 60 over the ground plane 56. The first insulator layer 60 is preferably comprised of polyimide and has a thickness of between about 5 and 30 um.

Subsequently, we preferably form a high K dielectric layer 64 over the insulator layer 60. The high k dielectric layer has a dielectric constant greater than 3.9. The high k dielectric layer 64 is preferably comprised of $Ta_2O_5$. The high K dielectric layer preferably has a dielectric constant greater than 3.0 and more preferably greater than 3.9. High K layers have a dielectric constant greater than 3.0 and more preferably greater than 3.9.

Next, we form a coplanar wave guide (CPW) 68G 68S on the high k dielectric layer 64. The coplanar wave guide 68G 68S is preferably comprised of spaced conductive lines. The coplanar wave guide is a type of transmission line. The CPW can serve as a signal line of for RF circuits. The CPW is different in function and structure from the underlying interconnect metal layers (e.g., M1, M2).

After this we form a second insulator layer 76 over the coplanar wave guide 68G 68S and high k dielectric layer 64. The second insulator (polyimide) layer 76 is comprised of polyimide and has a thickness of between about 10 and 40 $\mu$m.

IV. Second Embodiment—FIG. 2

The second embodiment is similar to the first embodiment but, the high k layer 164 (e.g., $Ta_2O_5$) is thicker and there is no Au shield layer (e.g., 56).

Figure 2:
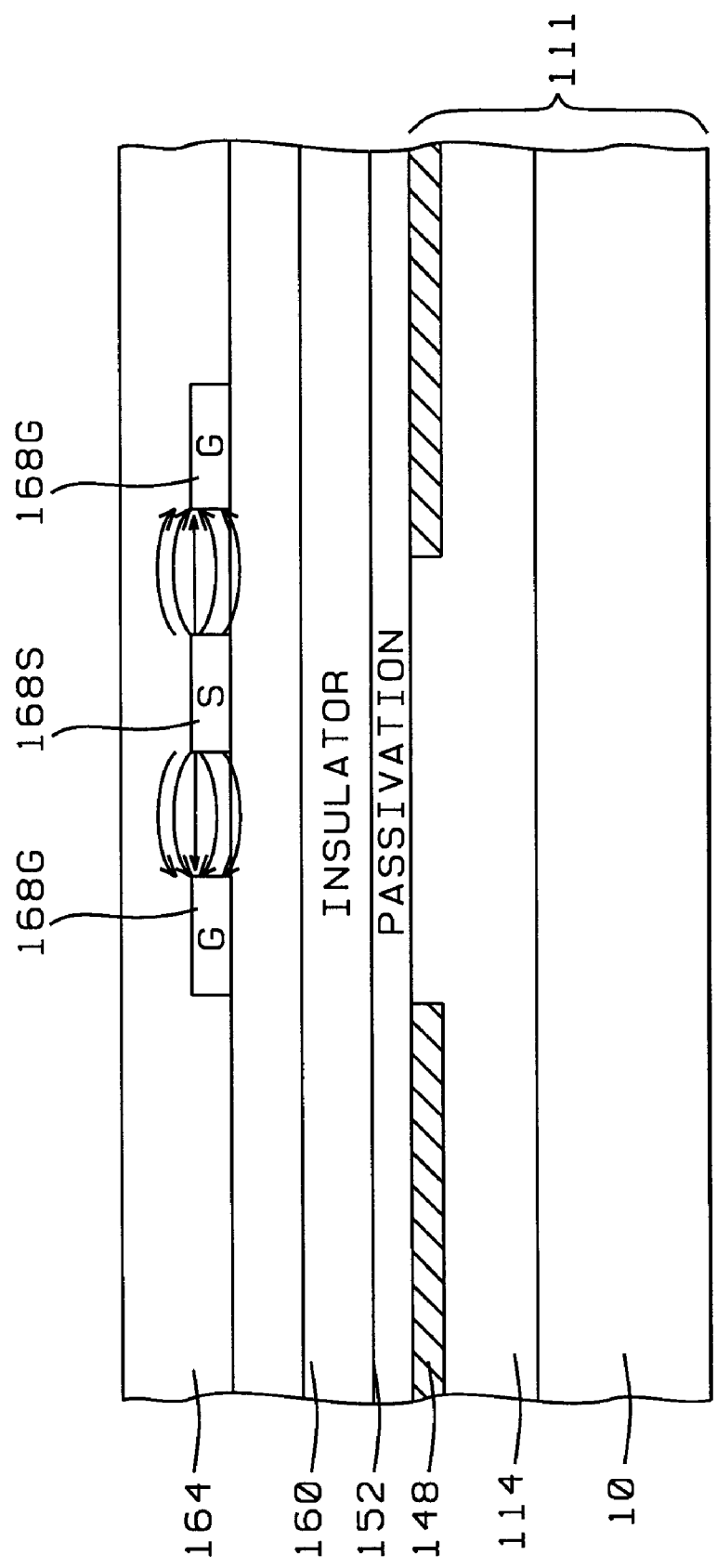
FIG. 2 is a cross sectional view of a device where the and the signal line (microstrip) as a conductive line over the dielectric (e.g., polyimide) layer 60 no shielding layer (e.g., 56) is used and the high k dielectric layer 164 is thicker than in the first embodiment (e.g., 64) according to the second embodiment of the present invention.

As shown in FIG. 2 providing a semiconductor structure 111 comprising a substrate 10 having devices formed thereover and a plurality of insulating and conductive layers thereover and a top metal layer 148. Preferably, the plurality of insulating and conductive layers has at least 5 insulating layer and 5 conductive layers.

A passivation layer 152 over the top metal layer 148 and the semiconductor structure 111. The passivation layer is preferably comprised of an oxide layer and a nitride layer (See above). The oxide layer preferably has a thickness of between about 5000 and 10,000 Å. The nitride layer preferably has a thickness between 1000 and 5000 Å.

Next, we form a first insulator layer 160 over the passivation layer 152. The first insulator layer 160 is preferably comprised of polyimide and has a thickness of between about 5 and 30 um.

Subsequently we form a high K dielectric layer 164 over the insulator layer 60. The high k dielectric layer has a dielectric constant greater than 3.9. The high k dielectric layer 64 is comprised of $Ta_2O_5$ or $Al2O3$ and most preferably of $Ta_2O_5$. The high k dielectric layer 64 is comprised of $Ta_2O_5$ and has a thickness of between about 300 and 1000 Å.

Now we form a coplanar wave guide 168G 168S on the high k dielectric layer 164. The coplanar wave guide 168G 168S comprised of spaced conductive lines.

We form a second insulator layer 176 over the coplanar wave guide 168G 168S and high k dielectric layer 164. The second insulator (polyimide) layer 176 is preferably comprised of polyimide. The second insulator (polyimide) layer 176 is preferably comprised of polyimide and has a thickness of between about 10 and 40 $\mu$m.

The second embodiment has the advantages of a complete block of the EM field from the CPW before the EM field reaches the substrate. Also, it allows active devices to be formed underneath the CPWs thus reducing chip size.

V. Third Embodiment—FIG. 3

The third embodiment is similar to the first embodiment but has a thicker Au layer (256) and no high k layer (e.g., 64).

Figure 3:
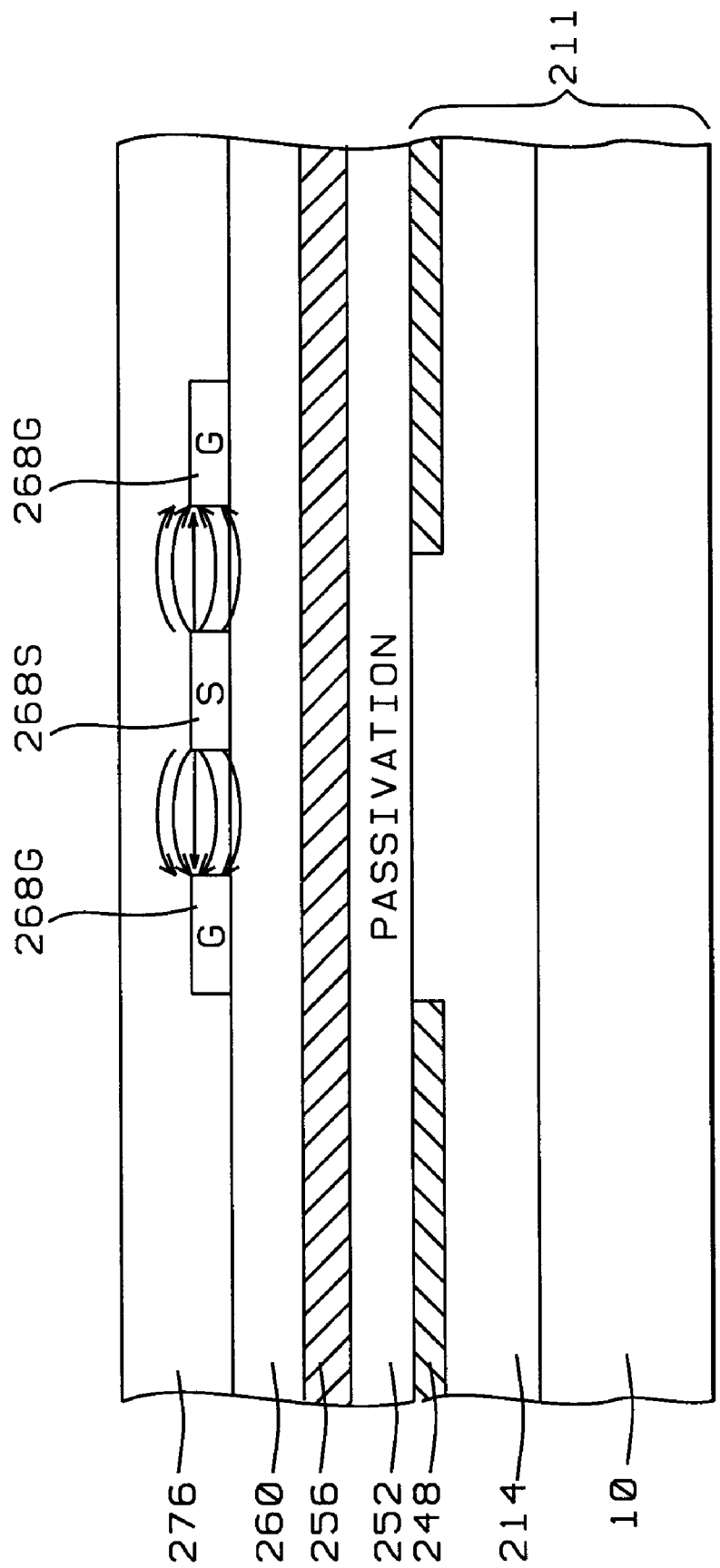
FIG. 3 is a cross sectional view of a device the ground plane as the top metal line and the signal line (microstrip) as a conductive line over the dielectric (e.g., polyimide) layer according to the third embodiment of the present invention.

As shown in FIG. 3, we provide a semiconductor structure 211 comprising a substrate 10 having devices formed thereover and a plurality of insulating and conductive layers and a top metal layer 248. The plurality of insulating and conductive layers preferably has at least 5 insulating layer and 5 conductive layers.

Next, we form a passivation layer 252 over the top metal layer 248 and the semiconductor structure 211. The passivation layer is preferably comprised of oxide and nitride (See above). The oxide layer preferably has a thickness of between about 5000 and 10,000 Å. The nitride layer preferably has a thickness between 1000 and 5000 Å.

Subsequently we form a thick ground plane (e.g., Au shielding plane) 256 over the semiconductor structure 11. The ground plane 256 is preferably comprised of Au or Cu and most preferably of Au. The ground plane preferably has a thickness so that approximately 95% or the e-field from the signal line is stop by the ground plane.

We form a first insulator layer 260 over the ground plane 56. The insulator layer 260 is comprised of polyimide and has a thickness of between about 5 and 30 um.

We form a coplanar wave guide 268G 268S on the high k dielectric layer 264. The coplanar wave guide 268G 268S comprised of spaced conductive lines.

Afterwards we form a second insulator layer 276 over the coplanar wave guide 268G 268S and second dielectric layer 265. The second insulator (polyimide) layer 76 is comprised of polyimide. The second insulator (polyimide) layer 276 is comprised of polyimide and preferably has a thickness of between about 1 and 6 μm.

The third embodiment has a advantage of forming devices under the CPW and provides a complete block of the EM field above the substrate.

VI. Fourth Embodiment—FIG. 4

A key feature of the fourth embodiment is that top metal layer formed under the CPW deposited and forms a shield.

Figure 4:
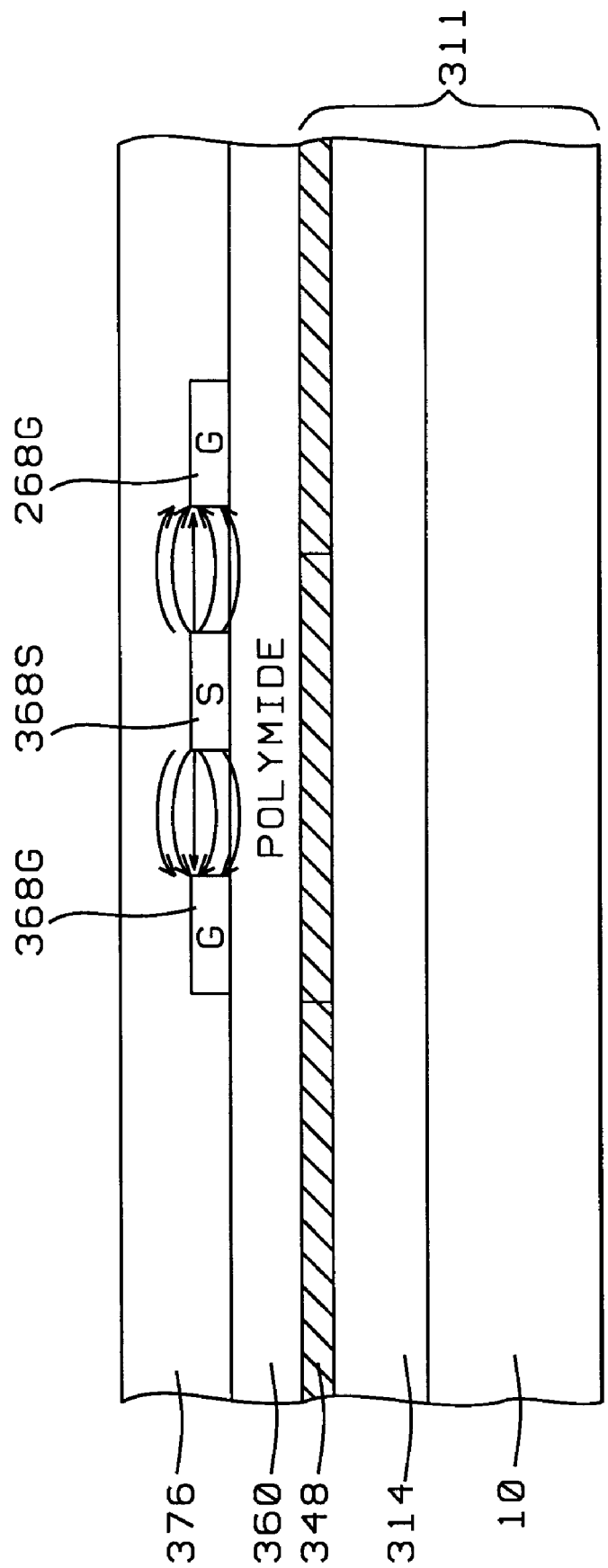
FIG. 4 is a cross sectional view of a device the ground plane as the top metal line and the signal line (microstrip) as a conductive line over the dielectric (e.g., polyimide) layer according to the fourth embodiment of the present invention.

As shown in FIG. 4, we provide a semiconductor structure 311 comprising a substrate 10 having devices formed thereover and a plurality of insulating and conductive layers thereover and a top metal layer 348. Preferably, the CPW 238S 368G is over the top metal layer 348. Preferably the CPW is under the entire CPW. That is the top metal layer does not have any openings under the CPW. The top metal layer forms a shield under the CPW. Preferably the top metal layer 348 overlies the entire substrate and does not have any openings. The top metal layer 348 acts as a shielding layer or grounding layer. Preferably the top metal layer is blank deposited over the entire surface. Structure 311 includes the substrate 10 and conductive 4 and insulating layers thereover.

The plurality of insulating and conductive layers has at least 5 insulating layer and 5 conductive layers.

Next we form a first insulator layer 360 over the top metal layer 348. The insulator layer 360 is comprised of polyimide and has a thickness of between about 5 and 30 um.

Next, we form a coplanar wave guide 368G 368S on the first insulating layer 360.

The coplanar wave guide 368G 368S comprised of spaced conductive lines.

We form a second insulator layer 376 over the coplanar wave guide 68G 68S and first insulating layer 360. The second insulator (polyimide) layer 376 is comprised of polyimide. The second insulator (polyimide) layer 376 is comprised of polyimide and has a thickness of between about 1 and 6 μm.

The fourth embodiment's top metal shield layer stops the EM field. This allows devices to be formed under the CPW. This reduces cost.

VII. Advantages of the Invention

The invention has the following advantages:
1. use high conductive top metal as transmission line ground plane.
2. use lossless polyimide which was deposited on the top of passivation layer as transmission line dielectric layer.
3. use metal layers (Au, Cu. Pt, and etc) which was plated or printed on top of polyimide as signal line.
4. use signal line and ground plane to confine the EM wave in the lossless polyimide to avoid the dissipation loss of Si-substrate.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a co-planar wave guide (CPW); comprising the steps of:
    a) providing a semiconductor structure comprising a substrate having devices formed thereover and a plurality of insulating and conductive layers thereover and a top metal layer;
    b) forming a passivation layer over said top metal layer and said semiconductor structure;
    c) forming a ground plane over said passivation layer;
    d) forming a first insulator layer over said ground plane;
    e) forming a high K dielectric layer over said insulator layer;
    f) forming a coplanar wave guide on said high k dielectric layer; and
    g) forming a second insulator layer over said coplanar wave guide and high k dielectric layer.

2. The method of claim 1 wherein said plurality of insulating and conductive layers has at least 3 insulating layers and 3 conductive layers.

3. The method of claim 1 wherein said passivation layer is comprised of an oxide layer and a nitride layer, said oxide layer has a thickness of between about 5000 and 10,000 Å; said nitride layer has a thickness between 1000 and 5000 Å.

4. The method of claim 1 wherein said ground plane is comprised of Au or Cu.

5. The method of claim 1 wherein said first insulator layer is comprised of polyimide and has a thickness of between about 5 and 30 um.

6. The method of claim 1 wherein said high k dielectric layer has a dielectric constant greater than 3.9.

7. The method of claim 1 wherein said high k dielectric layer 64 is comprised of $Ta_2O_5$ and has a thickness of between about 300 and 1000 Å.

8. The method of claim 1 wherein said coplanar wave guide comprised of spaced conductive lines.

9. The method of claim 1 wherein said second insulator layer is comprised of polyimide.

10. The method of claim 1 wherein said second insulator layer is comprised of polyimide and has a thickness of between about 10 and 40 μm.

11. A method of fabricating a co-planar wave guide (CPW); comprising the steps of:
   a) providing a semiconductor structure comprising a substrate having devices formed thereover and a plurality of insulating and conductive layers thereover and a top metal layer;
      (1) said plurality of insulating and conductive layers has at least 5 insulating layers and 5 conductive layers;
   b) forming a passivation layer over said top metal layer and said semiconductor structure;
      (1) said passivation layer is comprised of an oxide layer and a nitride layer, said oxide layer has a thickness of between about 5000 and 10,000 Å; said nitride layer has a thickness between 1000 and 5000 Å;
   c) forming a ground plane over said passivation layer;
      (1) said ground plane is comprised of Au;
   d) forming a first insulator layer over said ground plane;
      (1) said first insulator layer is comprised of polyimide and has a thickness of between about 5 and 30 um;
   e) forming a high K dielectric layer over said insulator layer; said high k dielectric layer has a dielectric constant greater than 3.9;
      (1) said high k dielectric layer is comprised of $Ta_2O_5$;
   f) forming a coplanar wave guide on said high k dielectric layer;
      (1) said a coplanar wave guide comprised of spaced conductive lines;
   g) forming a second insulator layer over said coplanar wave guide and high k dielectric layer;
      (1) said second insulator layer is comprised of polyimide and has a thickness of between about 10 and 40 $\mu$m.

12. A method of fabricating a co-planar wave guide; comprising the steps of:
   a) providing a semiconductor structure comprising a substrate having devices formed thereover and a plurality of insulating and conductive layers thereover and a top metal layer;
   b) forming a passivation layer over said top metal layer and said semiconductor structure;
   c) forming a first insulator layer over said passivation layer;
   d) forming a high K dielectric layer over said insulator layer; said high k dielectric layer has a dielectric constant greater than 3.9;
   e) forming a coplanar wave guide on said high k dielectric layer;
   f) forming a second insulator layer over said coplanar wave guide and high k dielectric layer.

13. The method of claim 12 wherein said first insulator layer is comprised of polyimide and has a thickness of between about 5 and 30 um.

14. The method of claim 12 wherein said high k dielectric layer is comprised of $Ta_2O_5$.

15. The method of claim 12 wherein said high k dielectric layer is comprised of $Ta_2O_5$ and has a thickness of between about 300 and 1000 Å.

16. The method of claim 12 wherein said a coplanar wave guide comprised of spaced conductive lines.

17. The method of claim 12 wherein said second insulator layer is comprised of polyimide.

18. The method of claim 12 wherein said second insulator layer is comprised of polyimide and has a thickness of between about 10 and 40 $\mu$m.

19. A method of fabricating a co-planar Wave guide; comprising the steps of:
   a) providing a semiconductor structure comprising a substrate having devices formed thereover and a plurality of insulating and conductive layers and a top metal layer;
   b) forming a passivation layer over said top metal layer and said semiconductor structure;
   c) forming a ground plane over said semiconductor structure;
   d) forming a first insulator layer over said ground plane;
   e) forming a coplanar wave guide on said high k dielectric layer; and
   f) forming a second insulator layer over said coplanar wave guide and second dielectric layer.

20. The method of claim 19 wherein said plurality of insulating and conductive layers has at least 5 insulating layers and 5 conductive layers.

21. The method of claim 19 wherein said ground plane is comprised of Au.

22. The method of claim 19 wherein said coplanar wave guide comprised of spaced conductive lines.

23. The method of claim 19 wherein said second insulator layer 76 is comprised of polyimide and has a thickness of between about 10 and 40 $\mu$m.

24. A method of fabricating a co-planar Wave guide; comprising the steps of:
   a) providing a semiconductor structure comprising a substrate having devices formed thereover and a plurality of insulating and conductive layers thereover and a top metal layer; said top metal layer overlies the entire substrate and does not have any openings; said top metal layer acts as a shielding layer or grounding layer;
   b) forming a passivation layer on said top metal layer;
   c) forming a first insulator layer over passivation layer;
   d) forming a coplanar wave guide on said first insulating layer; and
   e) forming a second insulator layer over said coplanar wave guide and first insulating layer.

25. The method of claim 24 wherein said plurality of insulating and conductive layers has at least 5 insulating layer and 5 conductive layers.

26. The method of claim 24 wherein said insulator layer is comprised of polyimide and has a thickness of between about 5 and 30 $\mu$m.

27. The method of claim 24 wherein said coplanar wave guide is comprised of spaced conductive lines.

28. The method of claim 24 wherein said second insulator layer is comprised of polyimide and has a thickness of between about 10 and 40 $\mu$m.

* * * * *